United States Patent [19]

Olson et al.

[11] 4,097,798
[45] Jun. 27, 1978

[54] OSCILLOSCOPE SWEEP RATE INDICATOR SYSTEM

[75] Inventors: David Harmon Olson; Eldon Carl Berg, both of Aloha, Oreg.

[73] Assignee: Tektronix, Inc., Beaverton, Oreg.

[21] Appl. No.: 772,879

[22] Filed: Feb. 28, 1977

[51] Int. Cl.$^2$ ............................................. G01H 23/02
[52] U.S. Cl. ................................. 324/78 D; 324/186; 328/129; 328/185
[58] Field of Search .................... 324/181, 186, 121 R, 324/183, 78 R, 78 D; 315/377; 328/129, 185

[56] References Cited

U.S. PATENT DOCUMENTS 3,439,282   4/1969   Moriyasu ............................ 328/185

OTHER PUBLICATIONS

Hewlett-Packard Co. Publication; Freq. & Time Measuring Equip., Apr. 1963; Catalog No. 24; pp. 120–122.

*Primary Examiner*—Robert J. Corcoran
*Attorney, Agent, or Firm*—George T. Noe

[57] ABSTRACT

A system for indicating the sweep rate of an oscilloscope time base. A counter is enabled by a sweep gate signal to permit clock pulses having a predetermined repetition rate to be counted during the time a sweep-driving ramp waveform is generated. The count output, which is proportional to the length of a time-base sweep, is decoded to generate specific control signals indicative of the sweep rate thereof. The control signals may then be used by a utilization means to provide a visual readout of the time-base sweep rate or to provide auto ranging for a digital voltmeter scaled in time units for time interval measurements.

3 Claims, 2 Drawing Figures

OSCILLOSCOPE SWEEP RATE INDICATOR SYSTEM

BACKGROUND OF THE INVENTION

As a basic measurement tool, the oscilloscope generally has a grid or graticule superimposed on the display screen which is divided into one-centimeter or one-half-inch divisions. The horizontal sweeping of the cathode-ray tube beam is generally calibrated to the graticule so that sweep rates of time units per graticule division may be established. The oscilloscope may have one or more time base generators, each of which includes a timing switch to permit selection of a plurality of calibrated sweep rates. Front panel indicia is provided to indicate the sweep rate chosen for a particular switch position. Additionally, uncalibrated continuously variable sweep rates between the calibrated steps may be obtained by means of a potentiometer. However, the uncalibrated sweep rates must be estimated by the operator.

In oscilloscopes having delaying and delayed sweep capability, the delay feature may be utilized to provide differential time measurements. A digital voltmeter is utilized to measure a voltage which is proportional to the time interval and provide a readout in time units. The voltmeter range must be changed each time the sweep rate is changed, and in present-day instruments this information is obtained through the use of extra contacts on the timing switch. It is a major problem in modifying existing oscilloscopes to provide the time interval measurement readout feature because the modification entails replacement of either the timing switch or the printed circuit board to provide the extra contacts.

SUMMARY OF THE INVENTION

According to the present invention, a system is provided for indicating the sweep rate of an oscilloscope time base. The information may be read out directly for either calibrated or uncalibrated sweeps, or may be utilized to automatically establish the range for a digital voltmeter scaled in time units for time interval measurements.

As a sweep is initiated in the time-base generator circuit, a counter is enabled by the leading edge of a sweep gate signal. The counter then begins to count clock pulses which are produced at a predetermined repetition rate by a clock pulse generator. When the sweep is terminated, the counter is disabled by the trailing edge of the sweep gate signal. The number of pulses counted during the interval during which the sweep ramp voltage is produced is proportional to the length of the time-base sweep. The count output thus obtained is decoded to provide specific control signals indicative of the sweep rate. The control signals, which may be in either serial or parallel form, may be utilized to provide the information required to automatically establish the range of a digital voltmeter which is scaled to provide time interval measurements, or such control signals may be utilized to provide a readout of the sweep rate. Since the sweep rate indication is derived from the sweep signal, a readout can be provided for both calibrated and uncalibrated sweep rates. Another useful application is in delayed-sweep oscilloscopes wherein the delayed sweep is superimposed upon the delaying sweep as an intensified segment. The timing and positioning controls could be adjusted so that the intensified zone extends between two points of interest, and the time interval therebetween read out digitally.

A latch or storage register may be inserted between a counter and a decoder, or at the decoder output, to store the information at the end of each sweep. The sweep gate signal may be used to update the latch, and to clear the counter after the information is stored in the latch. The sweep gate signal may also be utilized to synchronize the clock-pulse generator with the start of the sweep.

The present invention may be utilized in either delayed-sweep oscillosocpes having two time bases, or in an oscilloscope having a single time base. It may be built into the instrument, or may be installed by modification with a minimum of effort and expense. The present invention may facilitate either time interval measurements, or direct readout of sweep rate.

It is therefore one object of the present invention to provide a system for indicating the sweep rate of an oscilloscope time base.

It is another object of the present invention to provide a readout of either calibrated or uncalibrated sweep rates.

It is a further object of the present invention to provide a time interval measurement system which can provide information to automatically establish the range of a digital voltmeter scaled to read in time units.

It is an additional object of the present invention to provide a direct readout of time difference between two selectable points on a time-base display.

It is yet another object of the present invention to provide a sweep rate indicator system which can be installed into an existing oscilloscope with minimum effort and expense.

It is yet a further object of the present invention to provide a system for indicating the sweep rate of an oscilloscope time base in which the time duration of the sweep gate is measured directly.

Other objects and attainments of the present invention will become apparent to those skilled in the art upon a reading of the following detailed description when taken in conjunction with the drawings.

DRAWINGS

FIG. 1 shows a block diagram of a system for indicating the sweep rate of an oscilloscope time base in accordance with the present invention; and FIG. 2 illustrates a waveform ladder diagram showing the relationship of important waveforms of the system and the timing therebetween.

DETAILED DESCRIPTION

Figure 1:
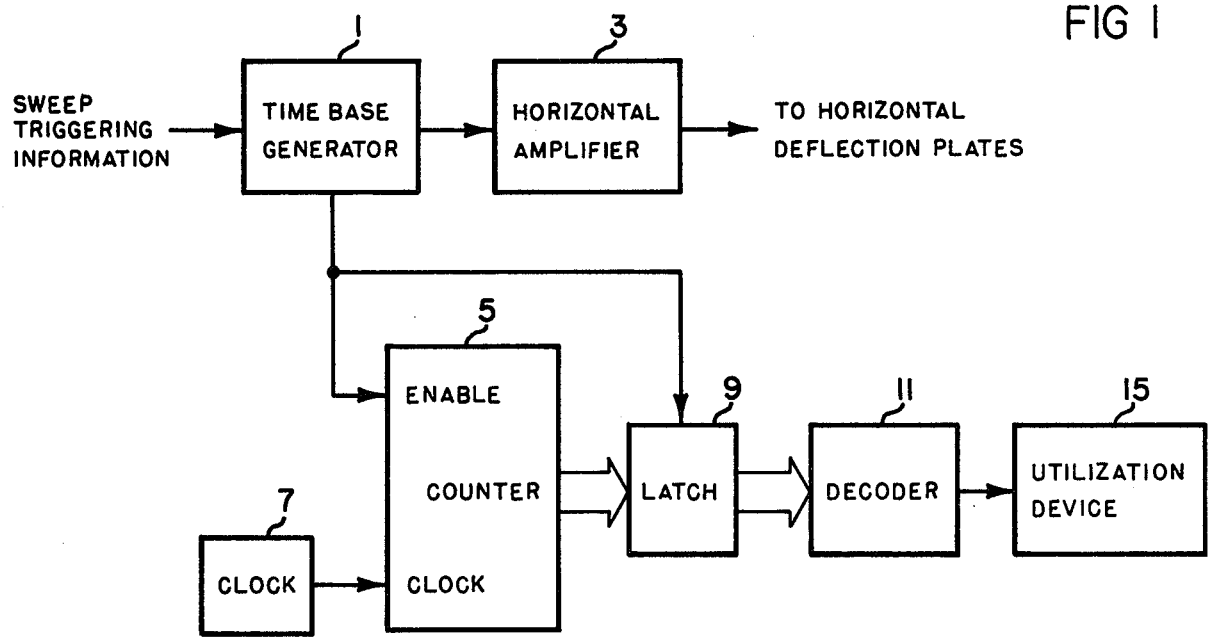
Figure 2:
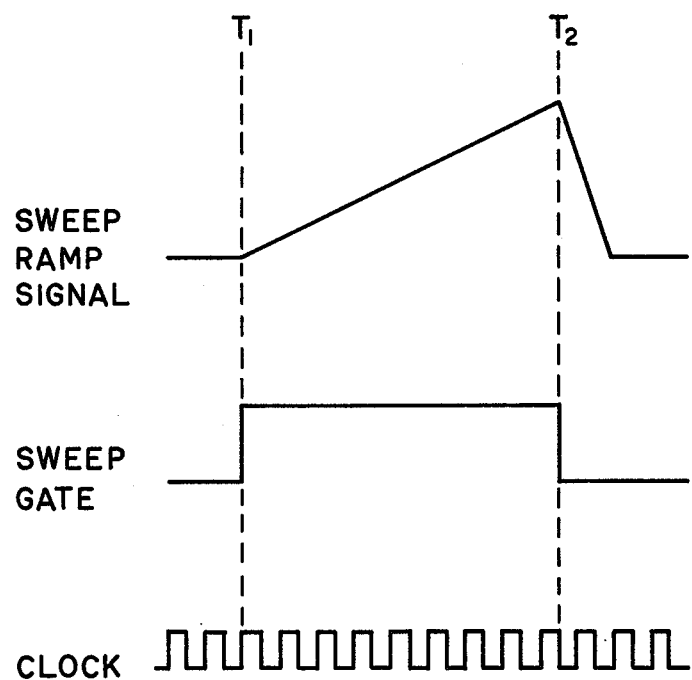

A block diagram of the sweep rate indicator system according to the present invention is shown in FIG. 1. While the system is principally intended for use in association with an oscilloscope, the majority of the oscilloscope circuits are not shown because the present invention pertains only to the time-base portion. A conventional time-base generator 1 typically includes a trigger generator portion and a sweep generator portion. The sweep triggering information may be applied thereto from either an external source or from the vertical amplifier so that the sweep may be initiated in synchronization with a displayed waveform. The sweep generator portion typically comprises a Miller integrator which produces a ramp signal such as that shown in FIG. 2. This ramp signal may be either positive-going or negative-going, and is produced by applying a constant current to a feedback capacitor. The values of timing current may be changed to produce different charging rates of the aforementioned feedback capacitor. This may be achieved by means of a timing switch which selects different resistors of predetermined value to provide predetermined values of timing current to thereby provide a plurality of selectable calibrated sweep rates, as is well known in the art. Also, a potentiometer may be selected to provide a continuously variable timing current in addition to that provided by a timing resistor so that a continuously variable sweep rate may be provided between calibrated steps. Thus, it can be discerned that the time between $T_1$ and $T_2$ shown in FIG. 2 is directly proportional to the length of time it takes the capacitor to charge between two predetermined voltage levels, and therefore bears a direct relationship with the sweep rate. The sweep ramp signal thus generated is applied to a conventional horizontal amplifier 3, where it is split into push-pull and amplified to a level suitable to drive a pair of electrostatic deflection plates in a cathode ray tube.

Between the time that a sweep is initiated and terminated, $T_1$ and $T_2$ respectively in FIG. 2, a sweep gate signal is produced by time base generator 1. This gate signal is typically applied to a Z-axis amplifier, from which the sweep gate signal is applied to the grid of the cathode ray tube to turn on the electron beam while the sweep signal is being produced. In accordance with the present invention, this sweep gate signal is utilized to enable a counter 5 at time $T_1$, which then begins to count clock pulses from a clock 7. Counter 5 may suitably be one or more commercially available integrated-circuit counters, the number depending upon the number of clock pulses to be counted. The clock 7 may suitably be a commercially-available integrated-circuit clock, or may be made up of discrete components in the form of a high speed multivibrator or oscillator. The frequency of the clock pulses may be any desired value; however, the frequency or repetition rate of such pulses should be high enough to ascertain the desired accuracy at the higher sweep rates. For example, for a sweep rate of 1 microsecond per division, the sweep length is 10 microseconds in length. Therefore, a clock rate of 1 MHz will produce ten clock pulses during that period. A 10 MHz clock will produce 100 pulses in the 10 microsecond sweep length, thereby providing an increased accuracy.

At time $T_2$, the sweep terminates, and the trailing edge of the sweep gate disables the counter 5 and strobes the count output into a latch 9. Latch 9 may suitably be one or more commercially-available storage resisters, depending upon the largest count expected. The contents of the latch are then decoded by decoder 11, which produces specific control signals from the count information. These control signals may be in the form of either serial or parallel data, and are applied to a utilization device 15, which may be, for example, a digital voltmeter. Thus, it can be discerned that the control signals may be utilized either to provide information required to automatically establish the range of such digital voltmeter which is scaled to provide time interval measurements, or the control signals may be utilized as data to provide a readout of the sweep rate.

The placement of latch 9 is not critical, and may be placed between decoder 11 and utilization device 15, or such latch may be eliminated altogether by arranging to run the counter only once each time a new setting of the timing switch is selected. The advantage of having the latch in the circuit is that such latch can be updated at the end of each sweep so that the output to the utilization device 15 is kept current. For this mode of operation, the counter 5 should be cleared after the latch is updated at the end of each sweep.

In summary, there has been described a sweep rate indicator system wherein a counter is enabled during the time that a sweep ramp signal is being produced so that such counter can count clock pulses for that period. The count signal can then be decoded to provide information to automatically establish the range of a digital voltmeter which is scaled to provide time interval measurements, or the decoder may provide control signals to provide a readout of the sweep rate.

It will be obvious to those skilled in the art that many changes may be made in the details of the above-described embodiment of the present invention without departing from the spirit of the invention.

We claim:

1. A sweep rate indicator system for indicating the sweep rate of an oscilloscope, comprising:
   a time-base generator circuit having a plurality of selectable fixed and variable sweep rates for providing a time-base ramp signal, said time-base generator circuit including means for generating a gate signal whose pulse width corresponds to the time period of said time-base ramp signal;
   means for generating clock pulses having a predetermined repetition rate;
   counter means responsive to said gate signal and said clock pulses for providing a count output proportional to the pulse width of said gate signal;
   decoder means responsive to said count output for generating therefrom a control signal indicative of the sweep rate of said time-base ramp signal; and
   means responsive to said control signal for providing a digital readout of said sweep rate.

2. A sweep rate indicator system in accordance with claim 1 wherein said counter means is enabled by the leading edge of said gate signal and disabled by the trailing edge of said gate signal so that said counter means operates during the time period of said time-base ramp signal.

3. A sweep rate indicator system in accordance with claim 1 further including latch means for updating said control signal at the end of each time period of said time-base ramp signal, said latch means being responsive to said gate signal.

* * * * *